(12) United States Patent
Lin

(10) Patent No.: US 8,389,869 B2
(45) Date of Patent: Mar. 5, 2013

(54) CIRCUIT BOARD HAVING PAD AND CHIP PACKAGE STRUCTURE THEREOF

(75) Inventor: Ko-Wei Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 343 days.

(21) Appl. No.: 12/554,340

(22) Filed: Sep. 4, 2009

(65) Prior Publication Data
US 2010/0212948 A1  Aug. 26, 2010

(30) Foreign Application Priority Data

Feb. 23, 2009  (TW) .............................. 98105656 A

(51) Int. Cl.
*H05K 1/11* (2006.01)
(52) U.S. Cl. ....................................................... 174/261
(58) Field of Classification Search .................. 174/261, 174/250, 253, 255–257, 262; 361/777, 780, 361/794
See application file for complete search history.

(56) References Cited

U.S. PATENT DOCUMENTS

| | | | |
|---|---|---|---|
| 6,448,504 B1 | 9/2002 | Taguchi | |
| 7,005,750 B2 * | 2/2006 | Liu | 257/779 |
| 7,115,819 B1 | 10/2006 | Rumsey | |
| 7,755,909 B2 * | 7/2010 | Kang et al. | 361/764 |
| 2007/0187141 A1 * | 8/2007 | Bartholomew | 174/261 |
| 2008/0123309 A1 | 5/2008 | Kang et al. | |
| 2009/0147490 A1 * | 6/2009 | Kawabata | 361/783 |

FOREIGN PATENT DOCUMENTS

| | | |
|---|---|---|
| CN | 1449031 | 10/2003 |
| JP | 08-340170 | 12/1996 |

OTHER PUBLICATIONS

"First Office Action of China Counterpart Application", issued on May 24, 2011, p. 1-p. 5, in which the listed references were cited.
"Office Action of Taiwan counterpart application" issued on Aug. 29, 2012, p. 1-p. 6, in which the listed reference was cited.

* cited by examiner

*Primary Examiner* — Jeremy Norris
*Assistant Examiner* — Tremesha S Willis
(74) *Attorney, Agent, or Firm* — J.C. Patents

(57) ABSTRACT

A circuit board including a substrate, a conductive pattern and a solder mask layer is provided. The conductive pattern includes a pad, a tail trace and a signal trace. The tail trace connects with the edge of the pad and the signal trace connects with the edge of the pad. An angle between a portion of the signal trace neighboring the pad and the tail trace is larger than 0 degree and smaller than 180 degree. The solder mask layer is disposed on the substrate and covers a portion of conductive pattern. The solder mask layer has an opening exposing the whole pad.

11 Claims, 2 Drawing Sheets

CIRCUIT BOARD HAVING PAD AND CHIP PACKAGE STRUCTURE THEREOF

CROSS-REFERENCE TO RELATED APPLICATION

This application claims the priority benefit of Taiwan application serial no. 98105656, filed on Feb. 23, 2009. The entirety of the above-mentioned patent application is hereby incorporated by reference herein and made a part of this specification.

BACKGROUND OF THE INVENTION

1. Field of the Invention

The present invention relates to a circuit board and a chip package structure, in particular, to a circuit board having a pad of a non-solder mask defined configuration and a chip package structure.

2. Description of Related Art

The flip chip bonding technology disposes a plurality of chip pads on an active surface of a chip mainly in an area array manner and forms a plurality of bumps on the chip pads respectively. Next, the chip is flipped so that the bumps on the chip are electrically and mechanically connected to a plurality of pads on a chip carrier respectively.

The configuration of the pad on the chip carrier can be generally classified into two categories, that is, solder mask defined (SMD) and non-solder mask defined (NSMD) according to whether the solder mask covers the pad or not. Herein, NSMD is also referred to as pad defined. To the NSMD pad, as the opening of the solder mask layer exposes the pad entirely, the pad cannot be fixed on the substrate of the chip carrier via the solder mask layer and is easy to be peeled off.

SUMMARY OF THE INVENTION

The present invention provides a circuit board, which an NSMD pad thereof is not easy to be peeled off.

The present invention provides a chip package structure, and the contact density of a chip and a circuit board thereof is higher.

The present invention provides a circuit board including a substrate dielectric layer, a conductive pattern, and a solder mask layer. The conductive layer is disposed on the substrate dielectric layer and includes a first pad, a first tail trace, and a first signal trace. The first tail trace is connected with the edge of the first pad. The first signal trace is connected with the edge of the first pad, and an angle is formed between a portion of the first signal trace neighboring the first pad and the first tail trace. Herein, the angle is greater than 0 degree and smaller than 180 degree. The solder mask layer is disposed on the substrate dielectric layer, and covers a portion of the conductive pattern. The solder mask layer has a first opening that exposes the first pad entirely.

In one embodiment of the present invention, the angle is larger than or equal to 135 degree and smaller than 180 degree.

In one embodiment of the present invention, the first opening exposes a portion of the first signal trace neighboring the first pad and a portion of the first tail trace neighboring the first pad.

In one embodiment of the present invention, the conductive pattern further includes a second pad, a second tail trace, and a second signal trace. The second tail trace is connected with the edge of the second pad and the second signal trace is connected with the edge of the second pad. Moreover, an angle between a portion of the second signal trace neighboring the second pad and the second tail trace is 180 degree. The solder mask layer further includes a second opening that exposes the second pad entirely.

In one embodiment of the present invention, the second opening exposes a portion of the second signal trace neighboring the second pad and a portion of the second tail trace neighboring the second pad.

The present invention provides a chip package structure including a circuit board, a chip, a first conductive bump, and a molding compound. The circuit board includes a substrate dielectric layer, a conductive pattern, and a solder mask layer. The conductive pattern is disposed on the substrate dielectric layer and includes a first pad, a first tail trace, and a first signal trace. The first tail trace is connected with the edge of the first pad. The first signal trace is connected with the edge of the first pad, and an angle is formed between a portion of the first signal trace neighboring the first pad and the first tail trace. Herein, the angle is greater than 0 degree and smaller than 180 degree. The solder mask layer is disposed on the substrate dielectric layer, and covers a portion of the conductive pattern. The solder mask layer has a first opening that exposes the first pad entirely. The first conductive bump is disposed between the chip and the first pad. The molding compound encloses the chip and the first conductive bump.

In one embodiment of the present invention, the angle is larger than or equal to 135 degree and smaller than 180 degree.

In one embodiment of the present invention, the first opening exposes a portion of the first signal trace neighboring the first pad and a portion of the first tail trace neighboring the first pad.

In one embodiment of the present invention, the chip package structure further includes a second conductive bump. Herein, the conductive pattern further includes a second pad, a second tail trace, and a second signal trace. The second tail trace is connected with the edge of the second pad and the second signal trace is connected with the edge of the second pad. Moreover, an angle between a portion of the second signal trace neighboring the second pad and the second tail trace is 180 degree. The solder mask layer further includes a second opening that exposes the second pad entirely. The second conductive bump is disposed between the second pad and the chip, and the molding compound further encloses the second conductive bump.

In one embodiment of the present invention, the second opening exposes a portion of the second signal trace neighboring the second pad and a portion of the second tail trace neighboring the second pad.

In one embodiment of the present invention, a side wall of the molding compound substantially aligns with a side wall of the circuit board.

In one embodiment of the present invention, the chip package structure further includes an underfill, which is filled between the chip and the circuit board and encloses the first conductive bump.

In one embodiment of the present invention, the first conductive bump includes a copper bump or a solder bump.

In light of the foregoing, the tail trace which is connected with the pad and partially covered by the solder mask layer facilitates in fixing the pad on the substrate dielectric layer. Moreover, an angle larger than 0 degree and smaller than 180 degree can be formed between a portion of the signal trace neighboring the pad and the tail trace. Hence, the tail trace can be optionally disposed between the neighboring pad and signal trace so as to enhance the flexibility of circuit layout and the density of the pad of the circuit board.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
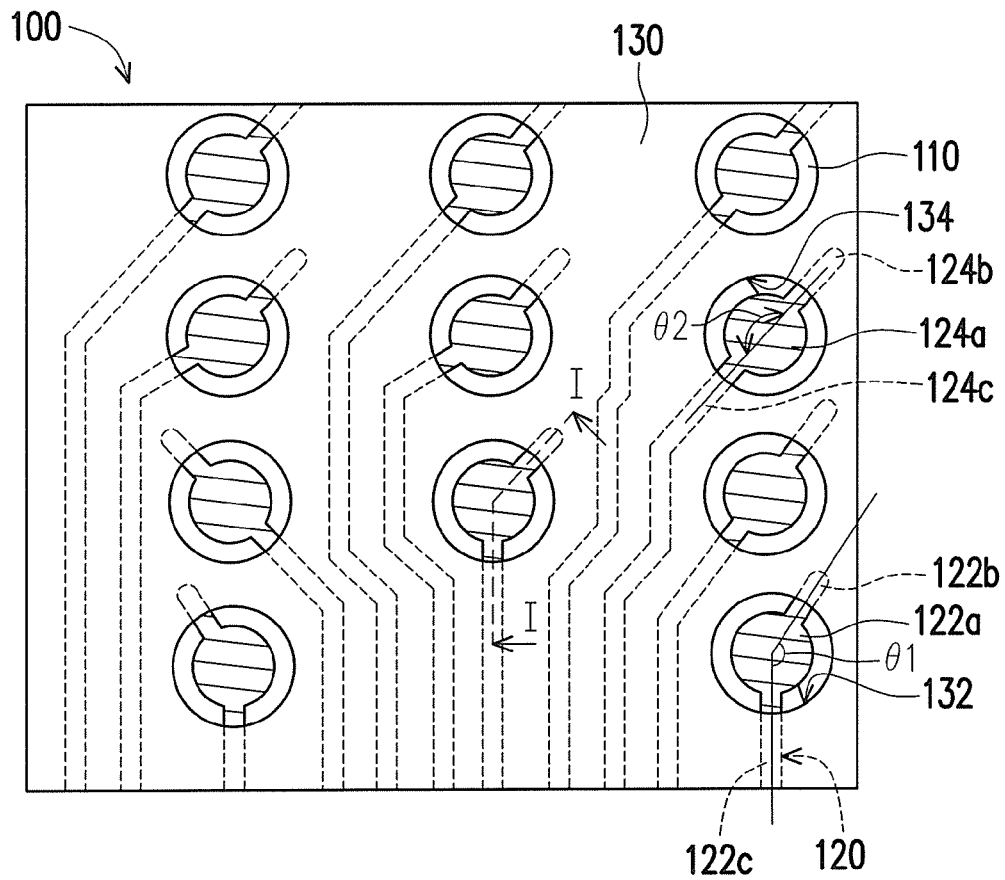
FIG. 1A is a partial top view schematically illustrating a circuit board according to an embodiment of the present invention.
Figure 1B:
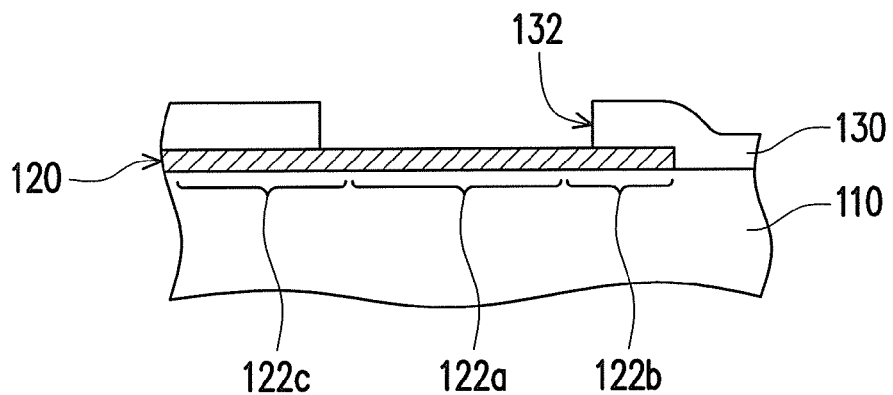
FIG. 1B is a cross-sectional view taken along Line I-I of the circuit board in FIG. 1A.

FIG. 1A is a partial top view schematically illustrating a circuit board according to an embodiment of the present invention. FIG. 1B is a cross-sectional view taken along Line I-I of the circuit board in FIG. 1A. Referring to FIG. 1A and FIG. 1B, a circuit board in the present embodiment includes a substrate dielectric layer 110, a conductive pattern 120, and a solder mask layer 130. The conductive pattern 120 is disposed on the substrate dielectric layer 110, and includes a plurality of pads 122a, a plurality of tail traces 122b, and a plurality of signal traces 122c. The tail trace 122b is connected with the edge of the pad 122a. The signal trace 122c is connected with the edge of the pad 122a. In addition, an angle $\theta 1$ is formed between a portion of the signal trace 122c neighboring the pad 122a and the tail trace 122b. The angle $\theta 1$ is larger than 0 degree and smaller than 180 degree. The angle $\theta 1$ is larger than or equal to 135 degree and smaller than 180 degree, for example.

Moreover, in the present embodiment, the conductive pattern 120 can optionally include a plurality of pads 124a, a plurality of tail traces 124b, and a plurality of signal traces 124c. The tail trace 124b is connected with the edge of the pad 124a, and the signal trace 124c is connected with the edge of the pad 124a. An angle $\theta 2$ between a portion of the signal trace 124c neighboring the pad 124a and the tail trace 124b is 180 degree. In other words, a portion of the signal trace 124c neighboring the pad 124a and the tail trace 124b can be on the same line.

The solder mask layer 130 is disposed on the substrate dielectric layer 110 and covers a portion of the conductive pattern 120. Specifically, the solder mask layer 130 includes a plurality of openings 132 and a plurality of openings 134. Here, the opening 132 exposes the pad 122a entirely, and the opening 134 exposes the pad 124a entirely. In details, in the present embodiment, the opening 132 further exposes a portion of the signal trace 122c neighboring the pad 122a, a portion of the tail trace 122b neighboring the pad 122a, and a portion of the substrate dielectric layer 110 in the periphery of the pad 122a. Furthermore, the opening 134 further exposes a portion of the signal trace 124c neighboring the pad 124a, a portion of the tail trace 124b neighboring the pad 124a, and a portion of the substrate dielectric layer 110 in the periphery of the pad 124a.

It should be noted that the tail traces 122b, 124b and the pads 122a, 124a are connected and the solder mask layer 130 partially covers the tail traces 122b, 124b. Therefore, the tail traces 122b, 124b facilitate in fixing the pads 122a, 124a on the substrate dielectric layer 110. In addition, as an angle $\theta 1$, which is larger than 0 degree and smaller than 180 degree, is formed between a portion of the signal trace 122c neighboring the pad 122a and the tail trace 122b, the tail trace 122b can be arbitrarily disposed between the neighboring pad 122a and signal trace 122c without affecting the disposition of the pad 122a and the signal trace 122c. On the other hand, if the angle $\theta 1$ is 180 degrees, the pad 122a would have to be moved away from the adjacent pad in order to maintain a reasonable distance between the tail trace 122b and the adjacent pad. This would undesirably increase the bump pitch and decrease the layout density. With the angle $\theta 1$ ranging from 0 degree to 180 degrees in the present invention, the flexibility of the circuit layout is enhanced and the density of the pad 122a is increased.

Figure 2:
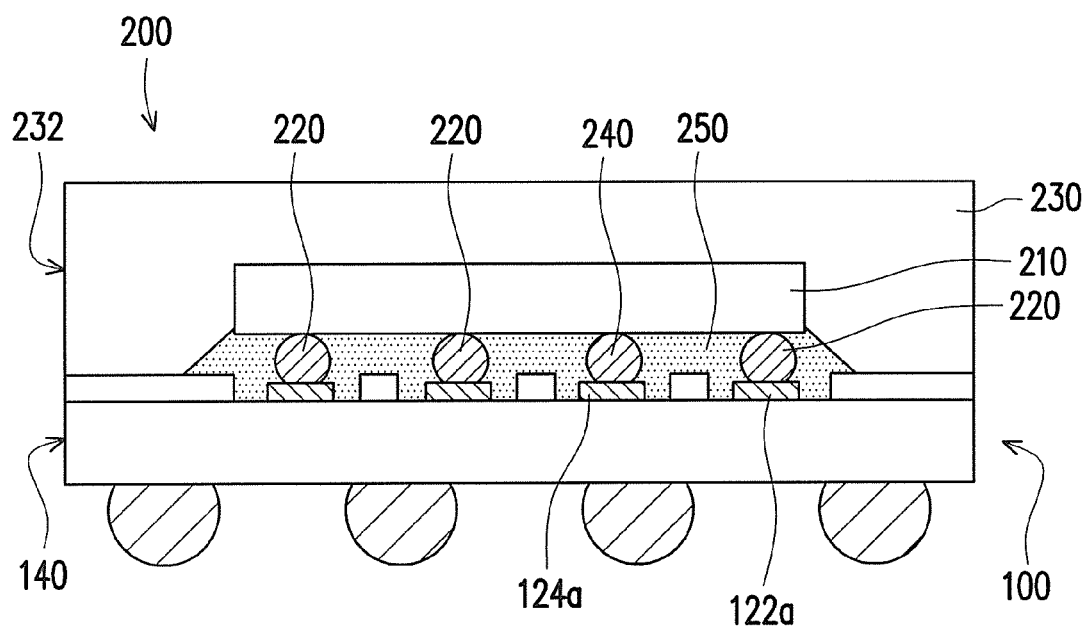
FIG. 2 is a cross-sectional view of a chip package structure according to an embodiment of the present invention.

FIG. 2 is a cross-sectional view of a chip package structure according to an embodiment of the present invention. Referring to FIG. 2, a chip package structure 200 of the present embodiment includes a circuit board 100, a chip 210, a plurality of conductive bumps 220, and a molding compound 230. It should be noted that the circuit board 100 of the present embodiment is identical to the circuit board 100 in FIG. 1A, and thus not repeated herein.

The conductive bump 220 is disposed between the chip 210 and the pad 122a for electrically connecting the chip 210 and the circuit board 100. Moreover, in the present embodiment, a conductive bump 240 can be disposed between the pad 124a and the chip 210. The conductive bumps 220, 240 are copper bumps or solder bumps, for instance. In the present embodiment, in order to protect the conductive bumps 220 and 240, an underfill 250 can be filled between the chip 210 and the circuit board 100 for enclosing the conductive bumps 220, 240.

The molding compound 230 encloses the chip 210 and the conductive bumps 220, 240 to protect the chip 210 and the conductive bumps 220, 240 from being contaminated by the external environment or moistened. In the present embodiment, a side wall 232 of the molding compound 230 is substantially aligned with a side wall 140 of the circuit board 100.

It should be noted that as the circuit board 100 has a high pad density, the pad density of the chip 210 can also be increased for reducing the size thereof, so as to reduce the production cost.

In summary, the tail trace which is connected with the pad and partially covered by the solder mask layer facilitates in fixing the pad on the substrate dielectric layer. Moreover, an angle larger than 0 degree and smaller than 180 degree can be formed between a portion of the signal trace neighboring the pad and the tail trace. Hence, the tail trace can be arbitrarily disposed between the neighboring pad and signal trace so as to enhance the flexibility of circuit layout and the density of the pad of the circuit board. Besides, as the circuit board of the present invention has a high pad density, the pad density of the chip being flip chip bonded to the circuit board can also be increased to reduce the size of the chip for lowering the production cost.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit board, comprising:
a substrate dielectric layer;
a conductive pattern, disposed on the substrate dielectric layer, the conductive pattern comprising:
a first pad, wherein the first pad is a solid circular pad and the first pad has only one first tail trace physically in direct contact with an edge of the first pad and a first signal trace physically in direct contact with another edge of the first pad, and a first angle is formed between a center line of the first signal trace and a center line of the first tail trace, wherein the first angle is greater than or equivalent to 135 degrees and smaller than 180 degrees; and
a solder mask layer, disposed on the substrate dielectric layer and covering a portion of the conductive pattern, wherein the solder mask layer comprises a first opening exposing the first pad entirely.

2. The circuit board as claimed in claim 1, wherein the first opening exposes a portion of the first signal trace neighboring to the first pad and a portion of the first tail trace neighboring to the first pad.

3. The circuit board as claimed in claim 1, wherein the conductive pattern further comprises:
a second pad, wherein the second pad is a solid circular pad and the second pad has only one second tail trace physically in direct contact with an edge of the second pad and a second signal trace physically in direct contact with another edge of the second pad, and a second angle of 180 degrees is formed between a center line of the second signal trace and a center line of the second tail trace, and
wherein the solder mask layer further comprises a second opening exposing the second pad entirely.

4. The circuit board as claimed in claim 3, wherein the second opening exposes a portion of the second signal trace neighboring to the second pad and a portion of the second tail trace neighboring to the second pad.

5. A chip package structure, comprising:
a circuit board, comprising:
a substrate dielectric layer;
a conductive pattern, disposed on the substrate dielectric layer, the conductive pattern comprising:
a first pad, wherein the first pad is a solid circular pad and the first pad has only one first tail trace physically in direct contact with an edge of the first pad and a first signal trace physically in direct contact with another edge of the first pad and a first angle is formed between a center line of the first signal trace and a center line of the first tail trace, wherein the first angle is greater than or equivalent to 135 degrees and smaller than 180 degrees;
a solder mask layer, disposed on the substrate dielectric layer and covering a portion of the conductive pattern, wherein the solder mask layer comprises a first opening exposing the first pad entirely;
a chip;
a first conductive bump, disposed between the chip and the first pad; and
a molding compound, encapsulating the chip and the first conductive bump.

6. The chip package structure as claimed in claim 5, wherein the first opening exposes a portion of the first signal trace neighboring to the first pad and a portion of the first tail trace neighboring to the first pad.

7. The chip package structure as claimed in claim 5, further comprising:
a second conductive bump,
wherein the conductive pattern further comprises:
a second pad, wherein the second pad is a solid circular pad and the second pad has only one second tail trace physically in direct contact with an edge of the second pad and a second signal trace physically in direct contact with another edge of the second pad, and a second angle of 180 degrees is formed between a center line of the second signal trace and a center line of the second tail trace,
wherein the solder mask layer further comprises a second opening which exposes the second pad entirely, the second conductive bump is disposed between the second pad and the chip, and the molding compound further encapsulates the second conductive bump.

8. The chip package structure as claimed in claim 7, wherein the second opening exposes a portion of the second signal trace neighboring to the second pad and a portion of the second tail trace neighboring to the second pad.

9. The chip package structure as claimed in claim 5, wherein a side wall of the molding compound substantially aligns with a side wall of the circuit board.

10. The chip package structure as claimed in claim 5, further comprising:
an underfill, filled between the chip and the circuit board, and covering the first conductive bump.

11. The chip package structure as claimed in claim 5, wherein the first conductive bump comprises a copper bump or a solder bump.

* * * * *